(12) United States Patent
Iizuka et al.

(10) Patent No.: US 6,875,667 B2
(45) Date of Patent: Apr. 5, 2005

(54) METHOD FOR FORMING CAPACITOR

(75) Inventors: Toshihiro Iizuka, Kanagawa (JP);
Tomoe Yamamoto, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/680,217

(22) Filed: Oct. 8, 2003

(65) Prior Publication Data

US 2004/0072401 A1 Apr. 15, 2004

(30) Foreign Application Priority Data

Oct. 10, 2002 (JP) ........................................ 2002-297612

(51) Int. Cl.$^7$ .............................................. H01L 21/20
(52) U.S. Cl. ........................ 438/381; 438/239; 438/240; 438/243; 438/253; 438/386; 438/387; 438/396
(58) Field of Search ................................ 438/238–241, 438/243, 244, 253, 381, 386–388, 393, 396

(56) References Cited

U.S. PATENT DOCUMENTS

| | | | | |
|---|---|---|---|---|
| 6,287,965 B1 | * | 9/2001 | Kang et al. ................. | 438/648 |
| 6,399,399 B2 | * | 6/2002 | Yamamoto .................. | 438/253 |
| 6,576,053 B1 | * | 6/2003 | Kim et al. ................... | 117/89 |
| 6,596,602 B2 | * | 7/2003 | Iizuka et al. ................ | 438/396 |
| 6,620,702 B2 | * | 9/2003 | Shih et al. .................. | 438/253 |
| 6,737,313 B1 | * | 5/2004 | Marsh et al. ............... | 438/240 |
| 6,777,353 B2 | * | 8/2004 | Putkonen .................... | 438/681 |
| 6,784,049 B2 | * | 8/2004 | Vaartstra .................... | 439/396 |

FOREIGN PATENT DOCUMENTS

| | | |
|---|---|---|
| JP | 5-13706 | 1/1993 |
| JP | 2002-222934 | 8/2002 |

* cited by examiner

Primary Examiner—Kevin M. Picardat
(74) Attorney, Agent, or Firm—McGinn & Gibb, PLLC

(57) ABSTRACT

A capacitor is provided that is optimal for use in DRAM and has high dielectric constant, and allows leakage current flowing therethrough to be maintained at a low level, and further, permits dependence of the leakage current on temperatures to be small. That is, capacitor openings are formed in an inter layer silicon oxide layer and a TiN film is patterned so that TiN films are left only within the openings to form lower electrodes within the openings. Subsequently, a Zr- and/or Hf-containing oxide film (represented by the formula, multicomponent $Zr_xHf_{1-x}O_2$ film ($0 \leq x \leq 1$)) formed from a metal-containing organic compound as a reactant and a Ti-containing oxide film are laminated to form capacitor dielectrics. After deposition of the Zr- and/or Hf-containing oxide film, the Zr- and/or Hf-containing oxide film is subjected to heat treatment to be performed in an oxidizing ambient to remove residual carbon being retained in the Zr- and/or Hf-containing oxide film, leading to formation of a capacitor that is optimal for use in DRAM and has high dielectric constant, and allows leakage current flowing therethrough to be maintained at a low level.

16 Claims, 15 Drawing Sheets

I-V CHARACTERISTICS OF CAPACITOR
OF FIRST CONVENTIONAL EXAMPLE

I-V CHARACTERISTICS OF CAPACITOR
OF SECOND CONVENTIONAL EXAMPLE

I-V CHARACTERISTICS OF CAPACITOR
OF FIRST EMBODIMENT

I-V CHARACTERISTICS OF CAPACITOR
OF SECOND EMBODIMENT

I-V CHARACTERISTICS OF CAPACITOR
OF THIRD EMBODIMENT

COMPARISON BETWEEN CAPACITANCE VALUES
OF INDIVIDUAL CAPACITORS
(1) FIRST CONVENTIONAL EXAMPLE
(2) SECOND CONVENTIONAL EXAMPLE
(3) FIRST EMBODIMENT
(4) SECOND EMBODIMENT
(5) THIRD EMBODIMENT

METHOD FOR FORMING CAPACITOR

BACKGROUND OF THE INVENTION

1. Field of the Invention

The present invention relates to a method for forming a capacitor, and particularly to a method for forming a capacitor having a Metal-Insulator-Metal (MIM) structure in which metal or metal nitride films are employed as upper and lower electrodes.

2. Description of the Related Art

As DRAM components are fabricated with higher density processes, capacitors are also formed to be smaller in size. Accordingly, a dielectric material, having dielectric constant greater than that of $SiO_2$, such as $Al_2O_3$, $TiO_2$, $(Ba, Sr)TiO_3$, $Pb(Zr, Ti)O_3$, is employed as capacitor dielectrics. In addition to the capacitor dielectrics having a high dielectric constant, upper and lower electrodes made of noble metal to reduce leakage current are provided to form a capacitor having a high dielectric constant.

First, explanation will be made of an example (referred to as a first conventional example) of a DRAM capacitor having a high dielectric constant with reference to FIGS. 1A, 1B and FIGS. 2A, 2B, highlighting a capacitor formation step and process steps just before and after the capacitor formation step.

In accordance with a process known to those skilled in the art, a silicon substrate 101, a field isolation film 102, gate oxide films 103, gate electrodes 104, LDD regions 105, diffusion layers 106, insulating films 107 formed on sidewalls of the gate electrodes 104, cobalt salicide layers 108, $Si_3N_4$ layers 109, interlayer dielectrics 110, connection holes 111, tungsten studs 113, etch stop layers 114, an interlayer silicon oxide layer 115 and openings 116 are formed (refer to FIG. 1A).

Subsequently, for example, a TiN film is deposited on the interlayer silicon oxide layer 115 using CVD or sputtering techniques. Then, the TiN film on the interlayer silicon oxide layer 115 is selectively etched back so that the TiN film is left only within each of the openings 116 to form lower electrodes 117 within the openings 116 (FIG. 1B). It should be noted that the etching back is performed by previously forming a resist film (not shown) within each of the openings 116 provided in the interlayer silicon oxide layer 115 in order to protect the lower electrode 117. The resist film is removed after completion of the etching back.

Subsequently, a $TiO_2$ film is deposited as the capacitor dielectrics 119 using, for example, Atomic Layer Deposition (ALD) techniques (FIG. 2A). In this example, the two reactants are $TiCl_4$ and $H_2O$. In this case, instead of $H_2O$, $O_3$ may be used. The $TiO_2$ film is deposited to a thickness of 10 to 30 nm. A deposition temperature employed is from 250.degree. to 400.degree. C. and pressure employed is from 25 mTorr to 1000 mTorr.

Thereafter, a lamination 122 of TiN and W layers (lower layer: TiN film 120, upper layer: W 121) is formed as an upper electrode using CVD, sputtering or ALD techniques (FIG. 2A). Then, the lamination 122 is, for example, dry etched in a desirable pattern that makes up an upper electrode 122 and thus a capacitor is formed (FIG. 2B).

FIG. 3A illustrates leakage characteristics of the capacitor formed as described above. As can be seen from the figure, leakage current greatly increases with voltage at any measurement temperature and grows greatly in high measurement temperature ranges, verifying that the capacitor of the first example cannot satisfy data retention requirements on DRAM.

Then, a second conventional example to improve leakage characteristics of the capacitor of the first conventional example will be explained below. In the second conventional example, process steps excluding the step of forming capacitor dielectrics film are approximately the same as those employed in the first conventional example and therefore, explanation thereof is omitted.

In accordance with the process similar to that employed in the first conventional example, components ranging starting from a MOSFET to a lower electrode are formed as shown in FIG. 1B.

Subsequently, an $Al_2O_3$ film is formed as first capacitor dielectrics 218 using, for example, ALD techniques. The two reactants are Trimethyl Aluminum (TMA) and $H_2O$ or $O_3$. In this case, the $Al_2O_3$ film is deposited to a thickness of 1 to 5 nm. A deposition temperature employed is from 250.degree. to 400.degree. C. and pressure employed is from 25 mTorr to 1000 mTorr.

Thereafter, a $TiO_2$ film is formed as second capacitor dielectrics 219 using, for example, ALD techniques (FIG. 4A) The two reactants are $TiCl_4$ and $H_2O$. In this case, instead of $H_2O$, $O_3$ may be used. The $TiO_2$ film is deposited to a thickness of 1 to 15 nm. A deposition temperature employed is from 250.degree. to 400.degree. C. and pressure employed is from 25 mTorr to 1000 mTorr.

Thereafter, a lamination of TiN and W layers is formed as an upper electrode using, for example, CVD, sputtering or ALD techniques. Then, the lamination is, for example, dry etched in a desirable pattern that makes up an upper electrode 122 and thus a capacitor of the second conventional example is formed (FIG. 4B).

FIG. 3B illustrates leakage characteristics of the capacitor formed as described above. As can be seen from the figure, the capacitor of the second conventional example exhibits leakage characteristics which are greatly improved as compared to the capacitor of the first conventional example. However, instead, the capacitance per unit area is significantly reduced when compared with the capacitor of the first conventional example, as shown in FIG. 15.

In addition to the above-described capacitor dielectrics employed in the first and second conventional examples, another capacitor dielectrics, having low leakage current, such as a lamination of $ZrO_2$, $TiO_2$ and $ZrO_2$ layers or a lamination of $HfO_2$, $TiO_2$ and $HfO_2$ layers is disclosed in Japanese Patent Application No. 5(1993)-13706. Furthermore, Japanese Patent Application No. 2002-222934 to the inventors of the application discloses alternative capacitor dielectrics having low dependence of leakage current on temperatures and employing an $Al_2O_3$ film as a barrier insulating layer.

However, the capacitor dielectrics employed in the first and second conventional examples cannot satisfy the requirements that a DRAM capacitor has a high capacitance and at the same time, allows leakage current flowing there through to be maintained at a low level. Although Japanese Patent Application No. 5(1993)-13706 teaches that the capacitance insulating film employed therein is so effective to obtain high capacitance and low leakage current, it never gives detailed description of how leakage current through the capacitor dielectrics vary with temperatures and of what types of capacitor formation methods are employed to reduce the leakage current. During operation of semiconductor device, it must be ensured that a semiconductor device operates at a temperature of up to about 150.degree. C. and particularly, a semiconductor device fabricated incorporating together a memory device and a logic device is strongly required to allow leakage current flowing through capacitors used in the semiconductor device to be maintained at a low level even at high operating temperatures. Moreover, as described above, the technique disclosed in Japanese Patent Application No. 2002-222934 does not provide a method for forming a capacitor with a high capacitance because the capacitor incorporates therein an $Al_2O_3$ film as a barrier insulating layer.

SUMMARY OF THE INVENTION

An object of the present invention is to provide a capacitor that has high dielectric constant and allows leakage current flowing therethrough to be maintained at a low level while permitting dependence of the leakage current on temperatures to be small and ensuring stability of manufacture of capacitor.

A method for forming a capacitor according to a first aspect of the invention includes: (a) forming a lower electrode on a semiconductor substrate; (b) subjecting the substrate to an Atomic Layer Deposition (ALD) processing using a metal-containing organic compound containing one metal and an oxidizing agent to deposit a first metal oxide film on the lower electrode; (c) subjecting the substrate to heat treatment to be performed in an oxidizing ambient in order to remove residual carbon being retained in the first metal oxide film, resulting in formation of a first insulating film; (d) subjecting the substrate to an ALD processing using a metal-containing compound containing an alternative metal different from the one metal and an oxidizing agent to deposit a second metal oxide film on the first insulating film, resulting in formation of a second insulating film; and (e) forming an upper electrode on the second insulating film in order to form a capacitor including the lower electrode, first insulating film, second insulating film and upper electrode.

A method for forming a capacitor according to a second aspect of the invention includes: (a) forming a lower electrode on a semiconductor substrate; (b) subjecting the substrate to an ALD processing using a metal-containing compound containing one metal and an oxidizing agent to deposit a first metal oxide film on the lower electrode, resulting in formation of a first insulating film; (c) subjecting the substrate to an ALD processing using a metal-containing organic compound containing a metal different from the one metal and an oxidizing agent to deposit a second metal oxide film on the first insulating film; (d) subjecting the substrate to heat treatment to be performed in an oxidizing ambient in order to remove residual carbon being retained in the second metal oxide film, resulting in formation of a second insulating film; (e) forming an upper electrode on the second insulating film in order to form a capacitor including the lower electrode, first insulating film, second insulating film and upper electrode.

A method for forming a capacitor according to a third aspect of the invention includes: (a) forming a lower electrode on a semiconductor substrate; (b) subjecting the substrate to an ALD processing using a metal-containing organic compound containing one metal and an oxidizing agent to deposit a first metal oxide film on the lower electrode; (c) subjecting the substrate to an ALD processing using a metal-containing organic compound containing a metal different from the one metal and an oxidizing agent to deposit a second metal oxide film on the first metal oxide film; (d) subjecting the substrate to heat treatment to be performed in an oxidizing ambient in order to remove residual carbon being retained in the metal oxide films, resulting in formation of a capacitor film consisting essentially of the metal oxide films; and (e) forming an upper electrode on the capacitor film in order to form a capacitor including the lower electrode, capacitor film and upper electrode In the above-described methods according to the first and third aspects of the invention, the first insulating film is a metal oxide film containing at least one of Zr and Hf (represented by the formula, $Zr_x Hf_{1-x} O_2$ film ($0 \leq x \leq 1$)) and the second insulating film is a titanium oxide ($TiO_2$) film.

In the above-described method according to the second aspect of the invention, the first insulating film is a titanium oxide ($TiO_2$) film and the second insulating film is a metal oxide film containing at least one of Zr and Hf (represented by the formula, $Zr_x Hf_{1-x} O_2$ film ($0 \leq x \leq 1$)).

The capacitors formed using the methods for forming a capacitor according to the first through third aspects of the invention each include one insulating film having dielectric constant not less than 25 and an alternative insulating film having dielectric constant not less than 50. In this case, the flow of electrons within the one insulating film occurs by the so-called Fowler-Nordheim (F-N) tunnelling mechanism or by a direct tunneling mechanism and is affected to a small extent by variations in ambient temperatures, and the flow of electrons within the alternative insulating film is affected to a large extent by variations in ambient temperatures. Accordingly, those insulating films form a capacitor having a large capacitance value. Furthermore, interposing the one insulating film in which the flow of electrons is affected to a small extent by variations in ambient temperatures between the upper electrode and lower electrode allows dependence of leakage current between the upper electrode and lower electrode on temperatures to be maintained at a low level.

Furthermore, in the method, related to the manufacture of capacitor, of the invention, the liquid reactants for formation of capacitor dielectrics are employed to ensure that the reactants are delivered to the deposition chamber and therefore, the delivery of reactants becomes stable, allowing the capacitor to have capacitance substantially unchanged between lots and wafers.

DETAILED DESCRIPTION OF THE PREFERRED EMBODIMENTS

A method for forming a capacitor according to a first embodiment of the invention will be explained with reference to FIGS. 5 through 10 illustrating cross sectional views of associated manufacturing steps.

Figure 5A:
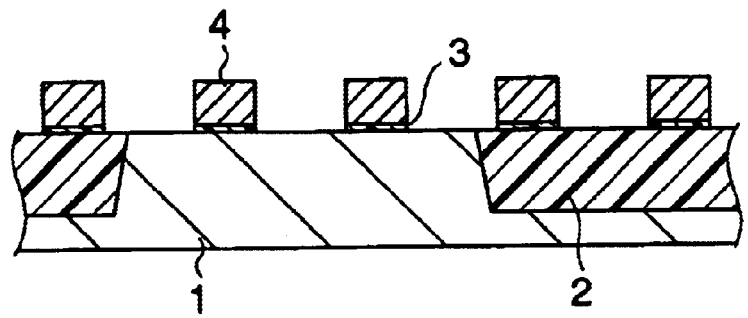
FIGS. 5A–C are cross sectional views of a capacitor formed using the method according to a first embodiment of the invention in the order of manufacturing steps.

First, in accordance with a process known to those skilled in the art, gate oxide films 3 and gate electrodes 4 are formed on a region that is separated from other regions by a field isolation film 2 in a silicon substrate 1 (FIG. 5A).

Subsequently, LDD regions 5 and diffusion layers 6 are formed in regions of the silicon substrate 1 on both sides of the gate electrode 4 to create a MOSFET. Furthermore, cobalt salicide layers 8 are formed in surface portions of the gate electrodes 4 and the diffusion layers 6 using typical Self Aligned Silicide (Salicide) techniques (FIG. 5C). The above-stated cobalt salicide layers are formed according to the following process steps.

Figure 5B:
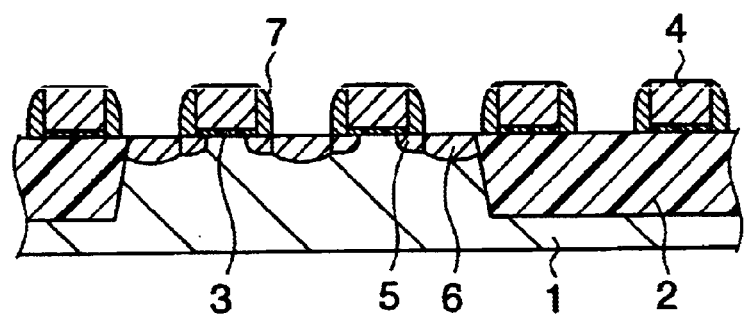
Figure 5C:
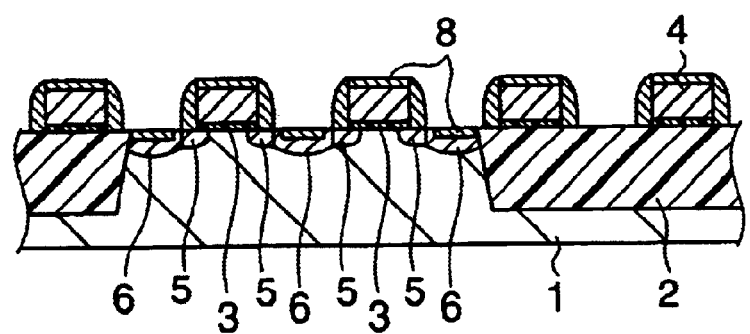

An insulating film 7 made of, for example, $SiO_2$ is deposited using CVD techniques, etc. to cover upper surfaces of the above-described MOSFETs shown in FIG. 5B and is etched back such that upper surfaces of the gate electrodes 4 and the diffusion layers 6 are exposed and simultaneously, the insulating films 7 are left on sidewalls of the gate electrodes 4 (FIG. 5B). Then, a cobalt film is deposited by sputtering over the entire structure. Thereafter, the substrate is subjected to Rapid Thermal Annealing (RTA) in order to react the exposed silicon of the upper portions of the gate electrodes 4 and the diffusion layers 6 with the cobalt films overlying the gate electrodes 4 and the diffusion layers 6, resulting in formation of the cobalt salicide layers 8. In this case, the cobalt films overlying the field isolation film 2 and the insulating films 7 do not react with those insulating films and therefore, are left as they are. The cobalt films left on those insulating films are removed by wet etching. Thus, the cobalt salicide layers 8 are formed (FIG. 5C).

Figure 6A:
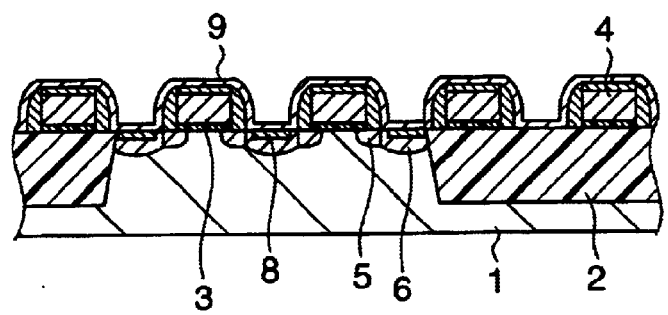
FIGS. 6A–C are cross sectional views illustrating the steps subsequent to the step of FIG. 5C.
Figure 6B:
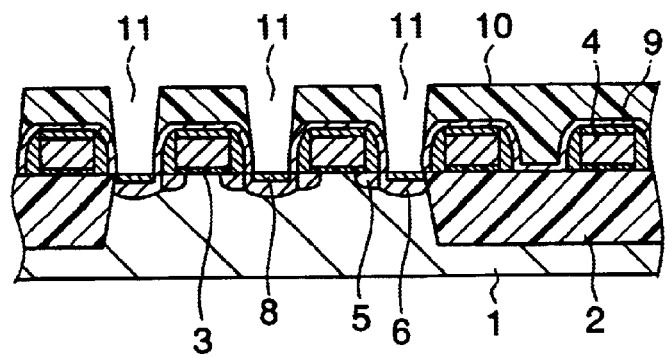

Subsequently, an $Si_3N_4$ film 9 is deposited using, for example, CVD techniques over the entire structure (FIG. 6A). Then, interlayer dielectrics 10 made of $SiO_2$ are deposited thereon. Thereafter, the above-described interlayer dielectrics 10 are selectively etched to form openings 11 in the film 10 (FIG. 6B).

Figure 6C:
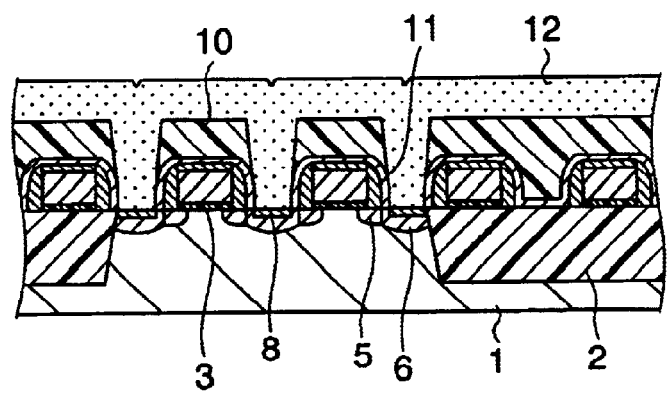

Subsequently, a tungsten layer 12 is deposited using CVD techniques on the interlayer dielectrics 10 having the openings 11 provided therein (FIG. 6C).

Figure 7A:
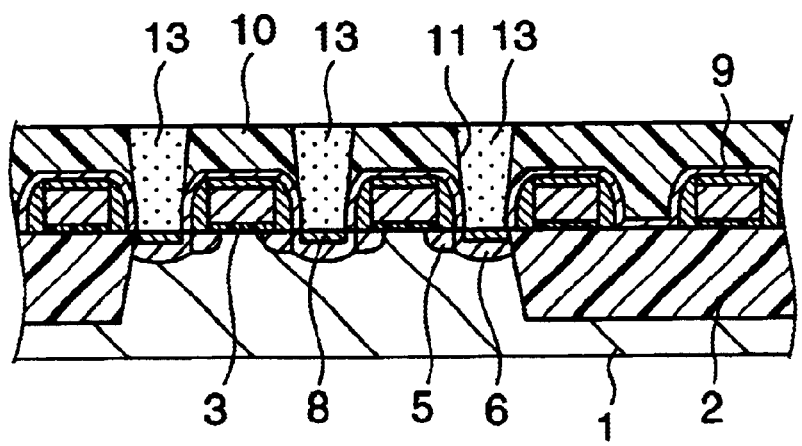
FIGS. 7A, 7B are cross sectional views illustrating the steps subsequent to the step of FIG. 6C.

Thereafter, the above-stated tungsten layer 12 is etched back to expose the interlayer dielectrics 10 and form tungsten studs 13 within the openings 11 (FIG. 7A).

Figure 7B:
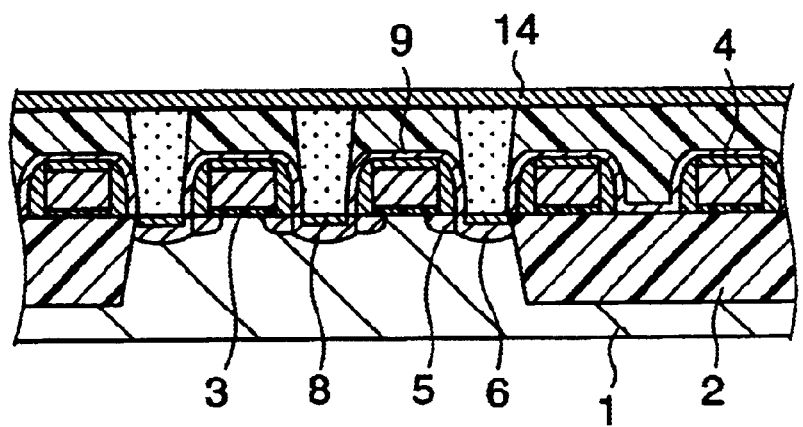
Figure 8A:
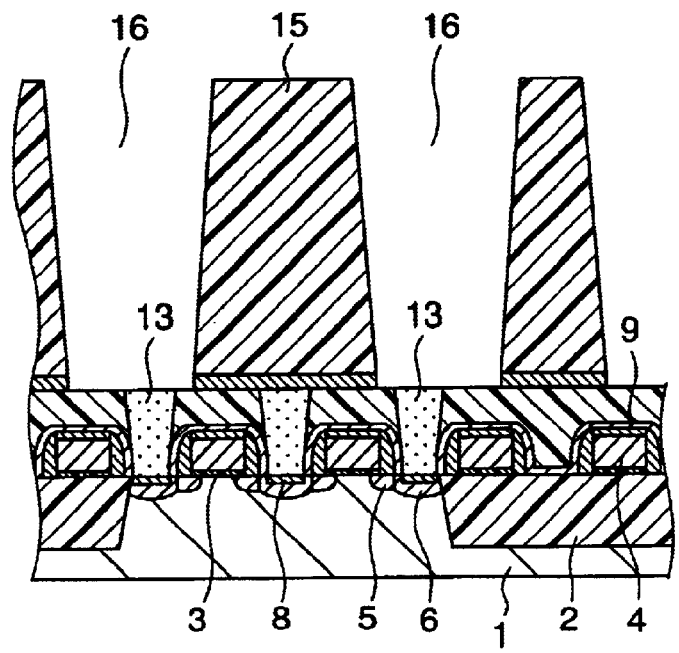
FIGS. 8A, 8B are cross sectional views illustrating the steps subsequent to the step of FIG. 7B.

Then, an etch stop film 14 made of $Si_3N_4$ is formed on the entire surface of the substrate (FIG. 7B). Furthermore, an interlayer silicon oxide layer 15 is deposited using plasma CVD techniques on the etch stop film 14 and desired portions of a lamination of the interlayer silicon oxide layer 15 and etch stop film 14 are removed to expose upper surfaces of the tungsten studs 13 that are connected to the corresponding lower electrodes, resulting in formation of capacitor openings 16 each making up a primary portion of capacitor (FIG. 8A).

Subsequently, a lower electrode film is deposited using CVD or sputtering techniques on the interlayer silicon oxide layer 15. Specifically, the lower electrode film that may be employed in the embodiment includes, but is not limited to: Ti, TiN, W, WN, Ru, Pt, Ir films or a lamination of combinations thereof. Among those films, the TiN film is highly preferred as the lower electrode film because adherence between the TiN film and the interlayer silicon oxide layer 15 underlying the TiN film is strong.

Figure 8B:
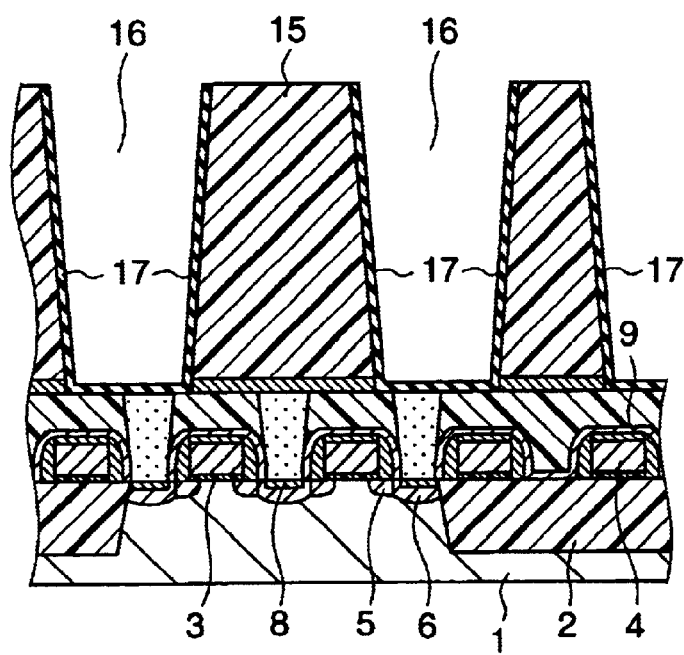

Thereafter, the lower electrode film on the interlayer silicon oxide layers 15 is etched back and selectively removed so that the lower electrode film is left only within the capacitor openings 16 to form lower electrodes 17 within the capacitor openings 16 (FIG. 8B). Note that the etching back is performed by previously forming a resist film (not shown) within each of the capacitor openings 16 provided in the interlayer silicon oxide layer 15 in order to protect the lower electrode 17. The resist film is removed after completion of the etching back.

Subsequently, first capacitor dielectrics 18 made from a metal-containing oxide film containing at least one of zirconium (Zr) and hafnium (Hf) are formed using ALD techniques. That is, the first capacitor dielectrics 18 are made from a $ZrO_2$ film, $HfO_2$ film or multicomponent $Zr_xHf_{1-x}O_2$ film ($0<x<1$). Although the inventors of the application initially contemplated that the dependence of leakage current flowing through those films on temperatures is large, the inventors have energetically studied those films and finally found that the absolute value of leakage current flowing through the films in a room temperature atmosphere is small and further, dependence of the leakage current on temperatures is significantly small when compared with other metal oxide films having relatively high dielectric constant.

When a $ZrO_2$ film is formed to make up capacitor dielectrics, the two reactants are a Zr-containing organic compound and an oxidizing agent. In more detail, the Zr-containing organic compound is represented by formulas $Zr(NCH_3C_2H_5)_4$, $Zr(OC(CH_3)_3)_4$, $Zr(N(CH_3)_2)_4$, $Zr(N(C_2H_5)_2)_4$ and at least one of the Zr-containing organic compounds represented by those formulas may be employed. The oxidizing agent may be $O_3$ or $H_2O$ and preferably, $O_3$ is used because oxidation readily takes place at low temperatures in the presence of $O_3$ as a powerful oxidizing agent.

When an $HfO_2$ film is formed to make up capacitor dielectrics, the two reactants are an Hf-containing organic compound and an oxidizing agent. In more detail, the Hf-containing organic compound is represented by the formulas $Hf(NCH_3 C_2 H_5)_4$, $Hf(OC(CH_3)_3)_4$, $Hf(N(CH_3)_2)_4$, $Hf(N(C_2 H_5)_2)_4$ and at least one of the Hf-containing organic compounds represented by those formulas may be employed. The oxidizing agent may be $O_3$ or $H_2O$ and preferably, $O_3$ is used because oxidation readily takes place at low temperatures in the presence of $O_3$ as a powerful oxidizing agent.

When a multicomponent $Zr_x Hf_{1-x} O_2$ film is formed to make up capacitor dielectrics, the above-described Zr-containing organic compound and Hf-containing organic compound are appropriately mixed with each other in advance to achieve a desired ratio of Zr to Hf (Zr/Hf) or vice-versa. Alternatively, the reactants and inert purge gas are pulsed into the following sequence and a complete series of pulses 1 through 4 is repeated:
1. Zr-containing organic compound
2. inert purge
3. Hf-containing organic compound
4. inert purge The reason why the above-mentioned organic compounds are used as a reactant for a Zr- and/or Hf-containing oxide film (represented by the formula, $Zr_x Hf_{1-x} O_2$ film ($0 \leq x \leq 1$)) is that the organic compound can be supplied in the liquid or gas phase to a deposition chamber. Those reactants are introduced into the deposition chamber from outside through delivery lines. Since the deposition chamber is decompressed, a liquid reactant is vaporized just before the deposition chamber and introduced therein to as a gas reactant. On the other hand, a metal chloride can be used as a reactant for a later-described $TiO_2$ film because it cannot be sublimated. However, both zirconium chloride and hafnium chloride can be sublimated and therefore, those metal chlorides cannot be used as a reactant. Since a solid material that can be sublimated is in the form of powder, the grain size of powder during use is gradually reduced with time. Accordingly, the surface area of powder is changed with time and then the amount of powder to be sublimated is increased with time. This means that the reactants that can be sublimated cannot stably be supplied. However, according to the embodiment, both zirconium and hafnium are forced to take the form of a metal-containing organic compound and then the metal-containing organic compound is supplied as a reactant in the liquid phase, allowing both the zirconium and hafnium-containing organic compounds to react with other reactants in a stable manner. Note that a solid reactant that cannot be sublimated is forced to take the form of liquid or gas by heating a storage tank storing the solid reactant and is delivered to a deposition chamber through delivery lines that are kept at a desirable temperature.

The Zr- and/or Hf-containing oxide film (represented by the formula, $Zr_x Hf_{1-x} O_2$ film ($0 \leq x \leq 1$)) is deposited to a thickness of 1 to 15 nm. A deposition temperature employed is from 250.degree. to 400.degree. C. and pressure employed is from 25 mTorr to 1000 mTorr.

Thereafter, to remove residual carbon being retained in the Zr- and/or Hf-containing oxide film, the film is subjected to heat treatment in an oxidizing ambient. The oxidizing ambient would be either $O_3$ or $O_2$ plasma, or dry oxygen ($O_2$) gas. The heat treatment is carried out for 5 to 30 minutes at temperature between 350 to 500.degree. C. Preferably, the heat treatment is carried out for 10 minutes at a temperature of 450.degree. C. in an ozone ($O_3$) atmosphere. The reason why residual carbon is removed is that an insulating film in which residual carbon is retained allows leakage current flowing therethrough to increase.

Figure 9A:
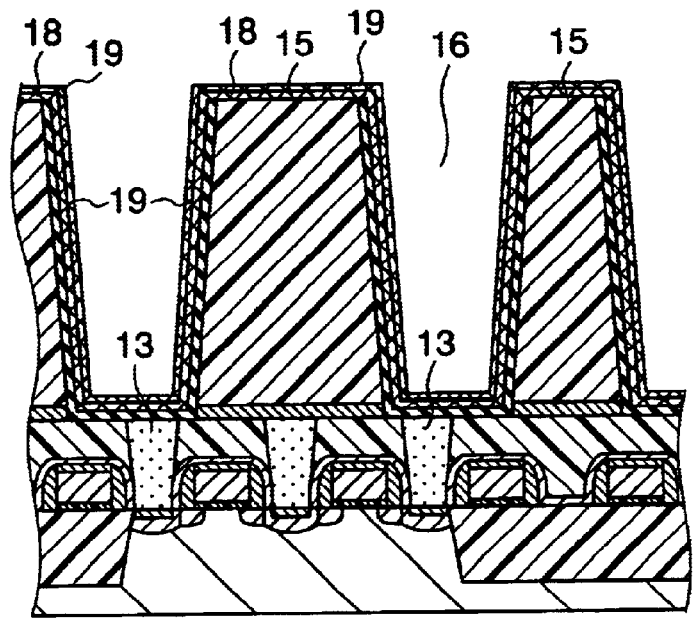
FIGS. 9A, 9B are cross sectional views illustrating the steps subsequent to the step of FIG. 8B.

Subsequently, a $TiO_2$ film is deposited as second capacitor dielectrics 19 on the above-described first capacitor dielectrics 18 using, for example, ALD techniques (FIG. 9A). The two reactants are a Ti-containing compound and an oxidizing agent. In more detail, the Ti-containing compound would be any one of metal-containing organic compounds represented by the formulas, $Ti(O-i-C_3 H_7)_4$, $Ti(NCH_3 C_2 H_5)_4$, $Ti(N(CH_3)_2)_4$, $Ti(N(C_2 H_5)_2)_4$, but however, $TiCl_4$ is employed in the embodiment. The reason why $TiCl_4$ is employed in the embodiment is that $TiCl_4$ cannot be sublimated. When the Ti-containing organic compound is employed as a reactant, heat treatment to remove residual carbon being retained in a titanium oxide film is needed, but when $TiCl_4$ is employed as a reactant, the heat treatment is not needed, resulting in reduction in the number of process steps corresponding to the heat treatment. Note that the heat treatment employed when the metal-containing organic compound is used as a reactant for the titanium oxide film is carried out under the same conditions as those employed when the Zr- and/or Hf-containing organic compound is used as a reactant for the Zr- and/or Hf-containing oxide film (represented by the formula, $Zr_x Hf_{1-x} O_2$ film ($0 \leq x \leq 1$)). The oxidizing agent may be $O_3$ or $H_2O$ and preferably, $O_3$ is used because oxidation readily takes place at low temperatures in the presence of $O_3$ as a powerful oxidizing agent. The $TiO_2$ film is deposited to a thickness of 1 to 15 nm. A deposition temperature employed is from 250.degree. to 400.degree. C. and pressure employed is from 25 mTorr to 1000 mTorr.

When an alternative Ti-containing oxide film such as a $SrTiO_3$ film or $(Ba, Sr)TiO_3$ film is employed as capacitor dielectrics instead of the $TiO_2$ film, a strontium-containing compound (e.g., $Sr(DPM)_2$) or barium-containing compound (e.g., $Ba(DPM)_2$) is used as a reactant along with $TiCl_4$ and $O_3$ as a co-reactant, those reactants and inert purge gas are pulsed into a deposition chamber and a complete series of pulses corresponding to those reactants and inert purge gas is repeated using ALD techniques, or those reactants are mixed in a deposition chamber and reacted with one another using CVD techniques.

Figure 9B:
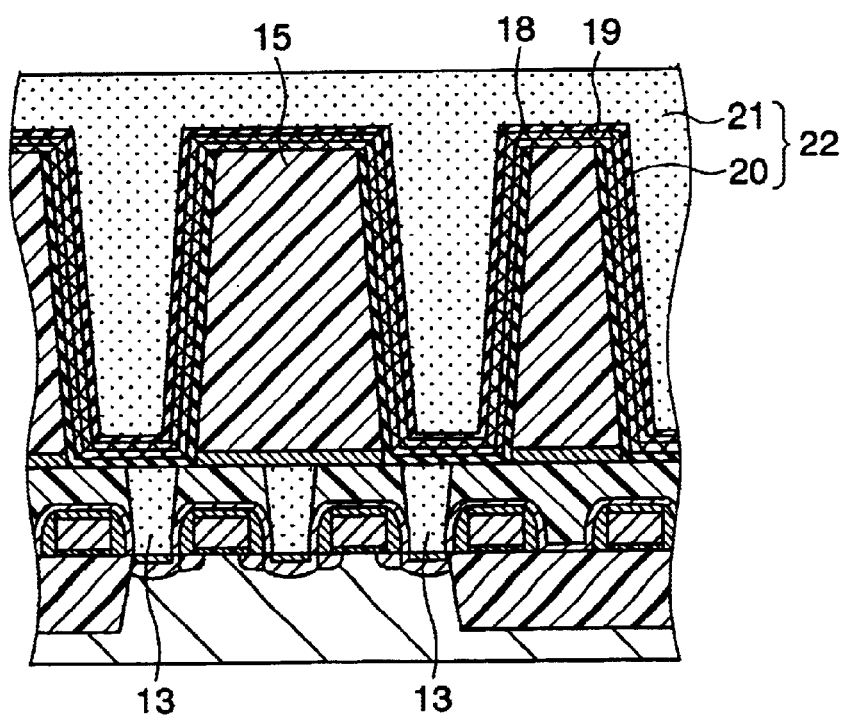

Thereafter, an upper electrode film is formed. In this case, a film material making up the upper electrode film is not particularly specified, but may be made of the material similar to that making up the lower electrode and preferably, a film material having strong adherence to interlayer dielectrics overlying the upper electrode is employed. For example, a lamination of a TiN film 20 and a W film 21 is deposited as an upper electrode film using CVD, sputtering or ALD techniques (FIG. 9B).

Subsequently, the upper electrode film is etched, together with a second insulating film 19 underlying the upper electrode film and a first insulating film 18 thereunder, in a desirable pattern using, for example, dry etching techniques, resulting in formation of an upper electrode 22. Thus, a capacitor is obtained using the method for forming a capacitor according to the invention.

Figure 10A:
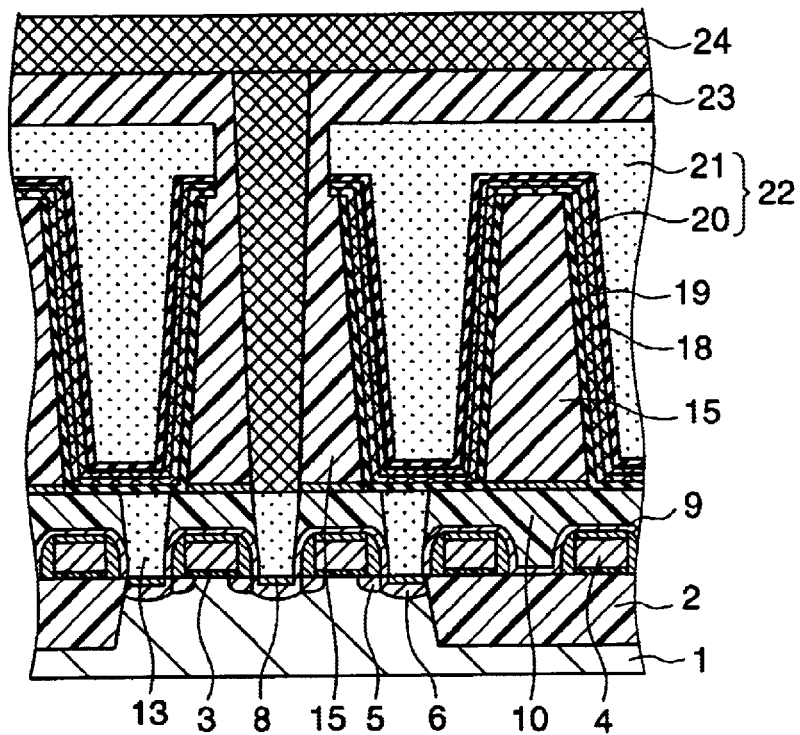
FIGS. 10A, 10B are cross sectional views illustrating the steps subsequent to the step of FIG. 9B.
Figure 10B:
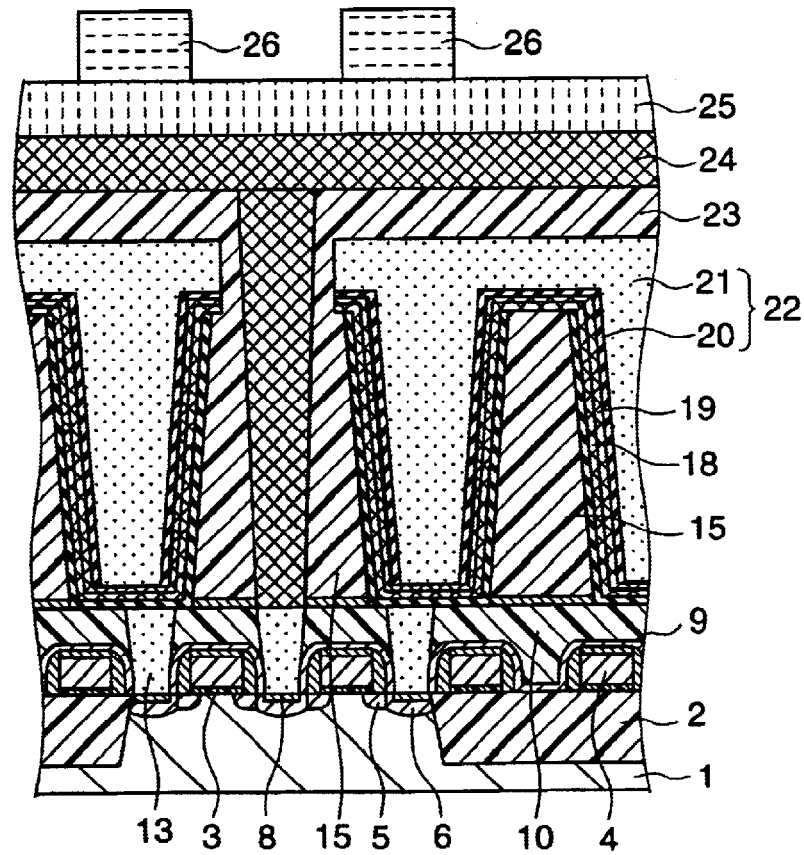

Then, in accordance with a process known to those skilled in the art, interlayer dielectrics 23, first interconnection layer 24, interlayer dielectrics 25, second interconnection layer 26 are formed in this order to obtain a desirable semiconductor device (FIGS. 10A, 10B).

A method for forming a capacitor according to a second embodiment of the invention will be explained below. The method according to the second embodiment has the same process steps as those employed in the first embodiment except for process steps related to formation of first and second capacitor dielectrics. Accordingly, the explanation thereof is omitted for simplification and explanation will be made of only the formation of first and second capacitor dielectrics.

Figure 11A:
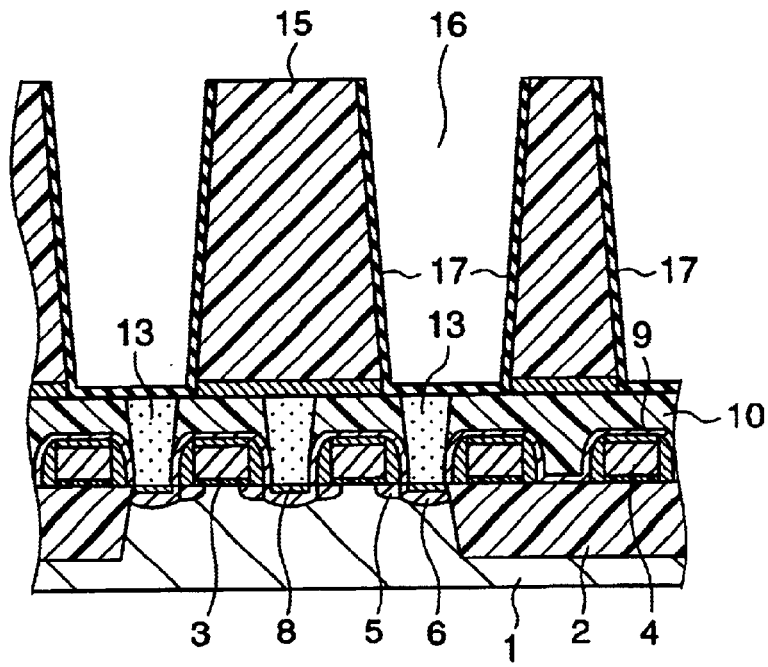
FIGS. 11A, 11B are cross sectional views of a capacitor formed using the method according to a second embodiment of the invention in the order of manufacturing steps.

In accordance with a process similar to that employed in the first embodiment, lower electrodes 17 are formed within capacitor openings 16 as shown in FIG. 11A.

Figure 11B:
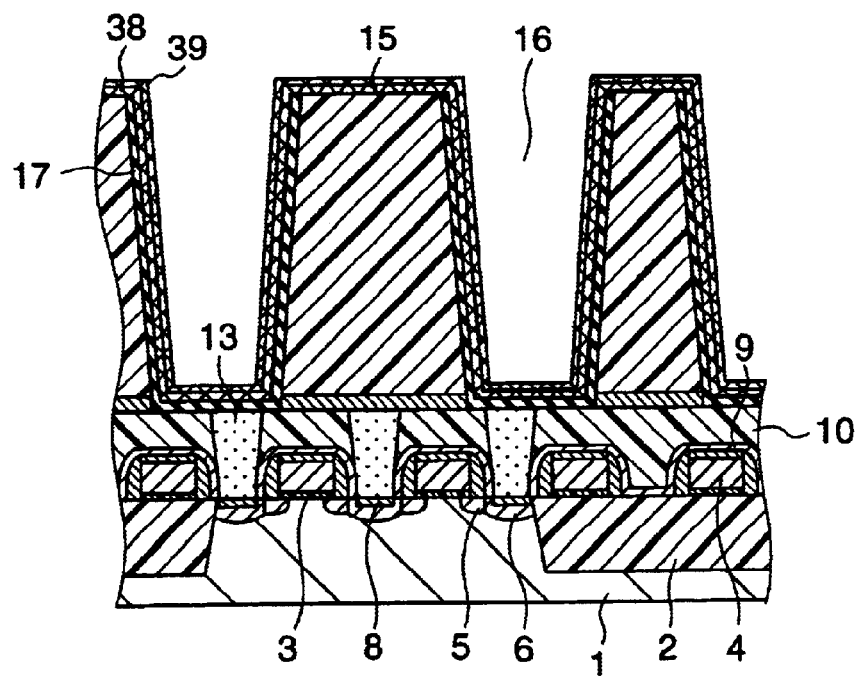

Thereafter, as shown in FIG. 11B, a $TiO_2$ film that is formed as a second insulating film in the first embodiment is formed as a first insulating film 38 in the embodiment. In this case, the $TiO_2$ film is deposited using, for example, ALD techniques. Furthermore, a reactant is $TiCl_4$ and an oxidizing agent is $O_3$ or $H_2O$, as is the case in the first embodiment. Additionally, the $TiO_2$ film is deposited to a thickness of 1 to 15 nm. A deposition temperature employed is from 250.degree. to 400.degree. C. and pressure employed is from 25 mTorr to 1000 mTorr.

Figure 12A:
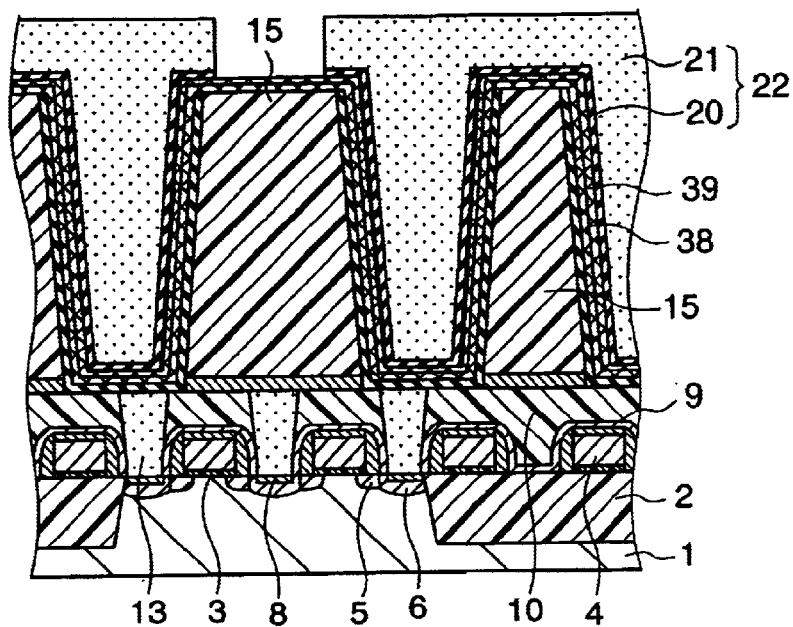
FIGS. 12A, 12B are cross sectional views illustrating the steps subsequent to the step of FIG. 11B.

Subsequently, as shown in FIG. 12A, a Zr- and/or Hf-containing oxide film (represented by the formula, $Zr_x Hf_{1-x} O_2$ film ($0 \leq x \leq 1$)) that is indicatedas the first insulating film 18 in the first embodiment is formed as a second insulating film 39 using, for example, ALD techniques. As is the case in the first embodiment, when a $ZrO_2$ film is formed to make up capacitor dielectrics, at least one of Zr-containing organic compounds represented by the formulas, $Zr(NCH_3 C_2 H_5)_4$, $Zr(OC(CH_3)_3)_4$, $Zr(N(CH_3)_2)_4$, $Zr(N(C_2 H_5)_2)_4$.sub.4 may be employed as a reactant. The oxidizing agent may be $O_3$ or $H_2O$ and preferably, $O_3$ is used because oxidation readily takes place at low temperatures in the presence of $O_3$ as a powerful oxidizing agent.

When an $HfO_2$ film is formed to make up capacitor dielectrics, at least one of Hf-containing organic compounds represented by the formulas, $Hf(NCH_3 C_2 H_5)_4$, $Hf(OC(CH_3)_3)_4$, $Hf(N(CH_3)_2)_4$, $Hf(N(C_2 H_5)_2)_4$.sub.4 may be employed as a reactant. The oxidizing agent may be $O_3$ or $H_2O$ and preferably, $O_3$ is used because oxidation readily takes place at low temperatures in the presence of $O_3$ as a powerful oxidizing agent.

When a multicomponent $Zr_x Hf_{1-x} O_2$ film is formed to make up capacitor dielectrics, the above-described Zr-containing organic compound and Hf-containing organic compound are appropriately mixed with each other to use those compounds as a reactant.

The multicomponent $Zr_x Hf_{1-x} O_2$ film ($0<x<1$) is deposited to a thickness of 1 to 15 nm. A deposition temperature employed is from 250.degree. to 400.degree. C. and pressure employed is from 25 mTorr to 1000 mTorr.

Thereafter, to remove residual carbon being retained in the multicomponent $Zr_x Hf_{1-x} O_2$ film ($0<x<1$), the film is subjected to heat treatment in an oxidizing ambient. The oxidizing ambient would be either $O_3$ or $O_2$ plasma or dry oxygen ($O_2$) gas. The heat treatment is carried out for 5 to 30 minutes at temperature between 350 to 500.degree. C. Preferably, the heat treatment is carried out for 10 minutes at a temperature of 450.degree. C. in an ozone ($O_3$) atmosphere.

Figure 12B:
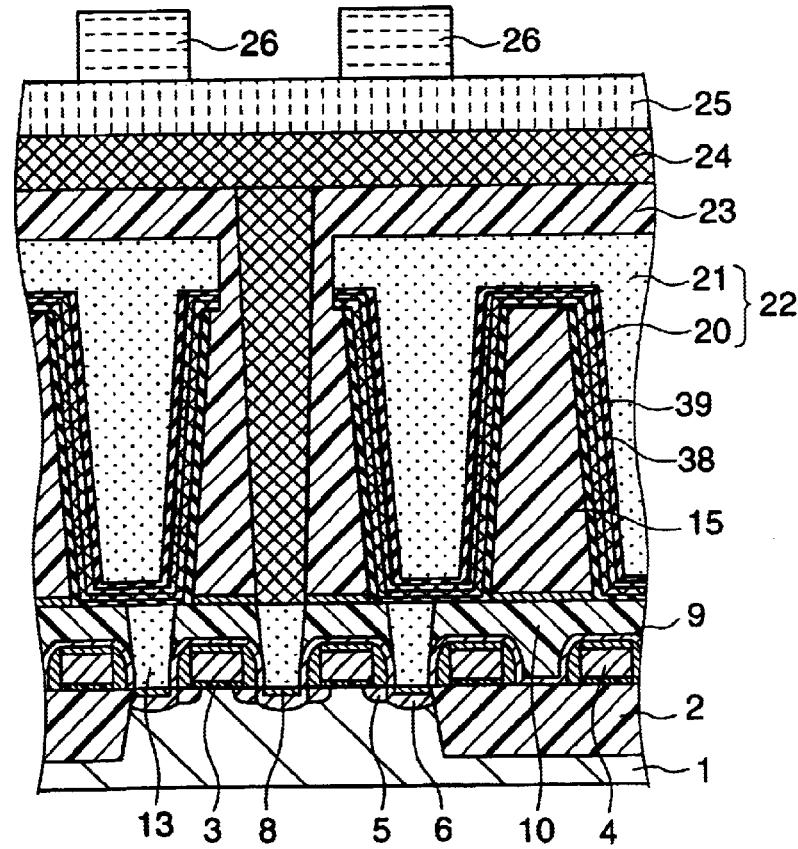

Subsequently, the entire structure is subjected to the same process steps employed in the first embodiment, resulting in capacitor formation using the method for forming a capacitor according to the second embodiment (FIG. 12B).

A method for forming a capacitor according to a third embodiment of the invention will be explained below. First and second insulating films-making up a capacitor of the third embodiment are formed in the same sequence as in the first embodiment and the third embodiment is different from the first embodiment only in that a third insulating film is formed on the second insulting film. Accordingly, the explanation of the first and second insulating films is omitted for simplification and explanation will be made of only the formation of third insulating film.

In accordance with a process similar to that employed in the first embodiment, lower electrodes 17 are formed within capacitor openings 16 as shown in FIG. 8B.

Figure 13A:
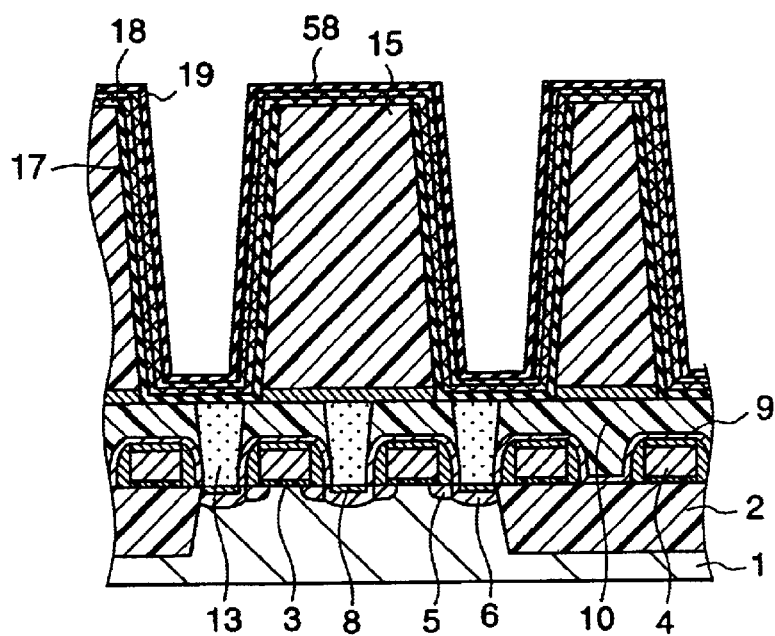
FIGS. 13A, 13B are cross sectional views of a capacitor formed using the method according to a third embodiment of the invention in the order of manufacturing steps.

Thereafter, as shown in FIG. 13A, a Zr- and/or Hf-containing oxide film (represented by the formula, $Zr_x Hf_{1-x} O_2$ film ($0 \leq x \leq 1$)) is formed as a first insulating film 18 using, for example, ALD techniques. In the case of $ZrO_2$ film (i. e., x=1), the two reactants would be a Zr-containing organic compound and an oxidizing agent. In more detail, the Zr-containing organic compound would be $Zr(NCH_3 C_2 H_5)_4$, $Zr(OC(CH_3)_3)_4$, $Zr(N(CH_3)_2)_4$, or $Zr(N(C_2 H_5)_2)_4$, etc. and at least one of those organic compounds may be employed as a reactant. The oxidizing agent would be $O_3$ or $H_2O$ and preferably, $O_3$ is used because oxidation readily takes place at low temperatures in the presence of $O_3$ as a powerful oxidizing agent.

When an $HfO_2$ film (i. e., x=0) is formed to make up capacitor dielectrics, the two reactants would be an Hf-containing organic compound and an oxidizing agent. In more detail, the Hf-containing organic compound would be $Hf(NCH_3 C_2 H_5)_4$, $Hf(OC(CH_3)_3)_4$, $Hf(N(CH_3)_2)_4$, or $Hf(N(C_2 H_5)_2)_4$, etc. and at least one of those organic compounds may be employed as a reactant. The oxidizing agent may be $O_3$ or $H_2O$ and preferably, $O_3$ is used because oxidation readily takes place at low temperatures in the presence of $O_3$ as a powerful oxidizing agent.

When a multicomponent $Zr_x Hf_{1-x} O_2$ film (i. e., $0<x<1$) is formed to make up capacitor dielectrics, the above-described Zr-containing organic compound and Hf-containing organic compound are appropriately mixed with each other to use those compounds as a reactant.

The multicomponent $Zr_x Hf_{1-x} O_2$ film ($0<x<1$) is deposited to a thickness of 1 to 15 nm. A deposition temperature employed is from 250.degree. to 400.degree. C. and pressure employed is from 25 mTorr to 1000 mTorr.

Thereafter, to remove residual carbon being retained in the multicomponent $Zr_x Hf_{1-x} O_2$ film ($0<x<1$), the film is subjected to heat treatment in an oxidizing ambient. The oxidizing ambient would be either $O_3$ or $O_2$ plasma or dry oxygen ($O_2$) gas. The heat treatment is carried out for 5 to 30 minutes at temperature between 350 to 500.degree. C. Preferably, the heat treatment is carried out for 10 minutes at a temperature of 450.degree. C. in an ozone ($O_3$) atmosphere.

Thereafter, a $TiO_2$ film employed as the second insulating film 19 in the first embodiment is deposited using, for example, ALD techniques. The two reactants are, for example, $TiCl_4$ and $O_3$ or $H_2O$ as an oxidizing agent. Furthermore, the $TiO_2$ film is deposited to a thickness of 1 to 15 nm. A deposition temperature employed is from 250.degree. to 400.degree. C. and pressure employed is from 25 mTorr to 1000 mTorr.

Figure 13B:
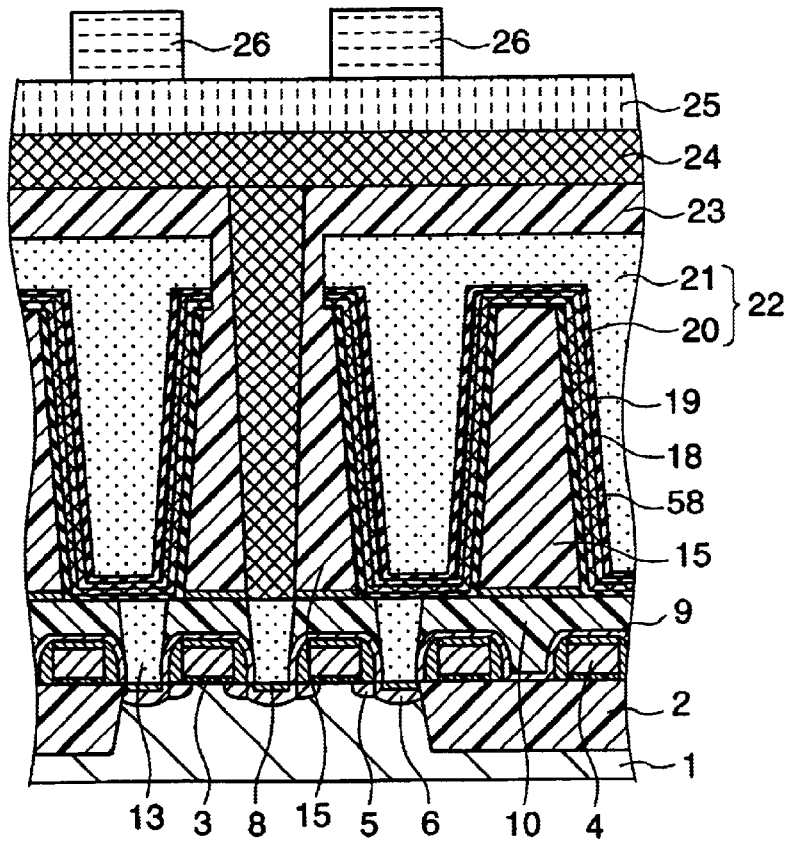

Subsequently, as shown in FIG. 13B, a Zr- and/or Hf-containing oxide film (represented by the formula, $Zr_x Hf_{1-x} O_2$ film ($0 \leq x \leq 1$) that is indicatedas the first insulating film 18 in the first embodiment is again formed as a third insulating film 58 on the second insulating film 19 using, for example, ALD techniques. In this case, the reactants would be the same as or different from those used when the first insulating film is deposited. That is, the first and third insulating films would have the same composition or different compositions.

Thereafter, to remove residual carbon being retained in the Zr- and/or Hf-containing oxide film (represented by the formula, $Zr_x Hf_{1-x} O_2$ film ($0 \leq x \leq 1$)), the film is subjected to heat treatment in an oxidizing ambient. The oxidation conditions may be the same as those employed after deposition of the first insulating film and the oxidizing ambient would be either $O_3$ or $O_2$ plasma or dry oxygen ($O_2$) gas. The heat treatment is carried out for 5 to 30 minutes at temperature between 350 to 500.degree. C. Preferably, the heat treatment is carried out for 10 minutes at a temperature of 450.degree. C. in an ozone ($O_3$) atmosphere.

Subsequently, the entire structure is subjected to the same process steps as those employed in the first embodiment, resulting in capacitor formation using the method for forming a capacitor according to the third embodiment (FIG. 13B).

Figure 14A:
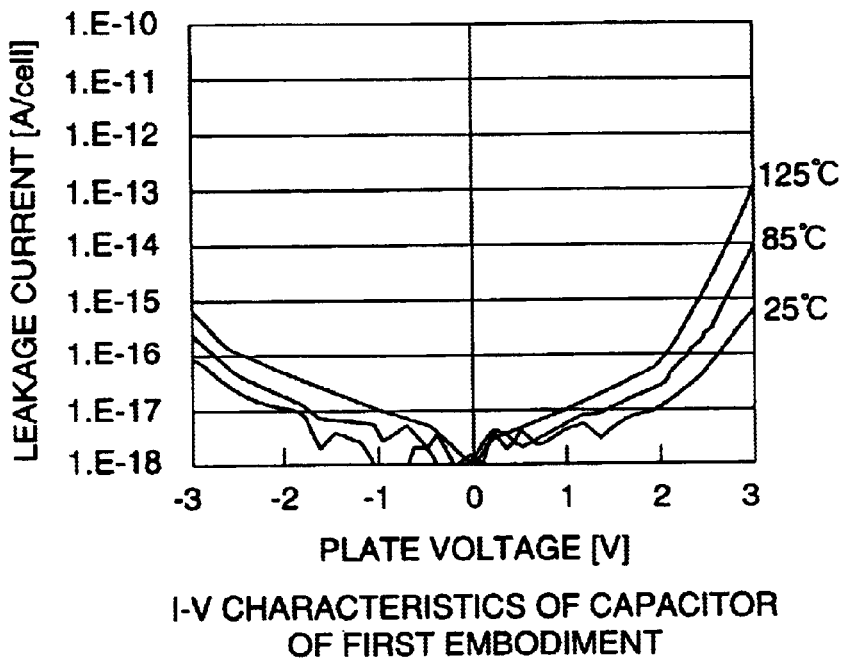
FIGS. 14A–C are illustrations of how the capacitors formed using the methods, related to formation of capacitor, according to the first through third embodiments allow leakage current to flow therethrough.
Figure 14B:
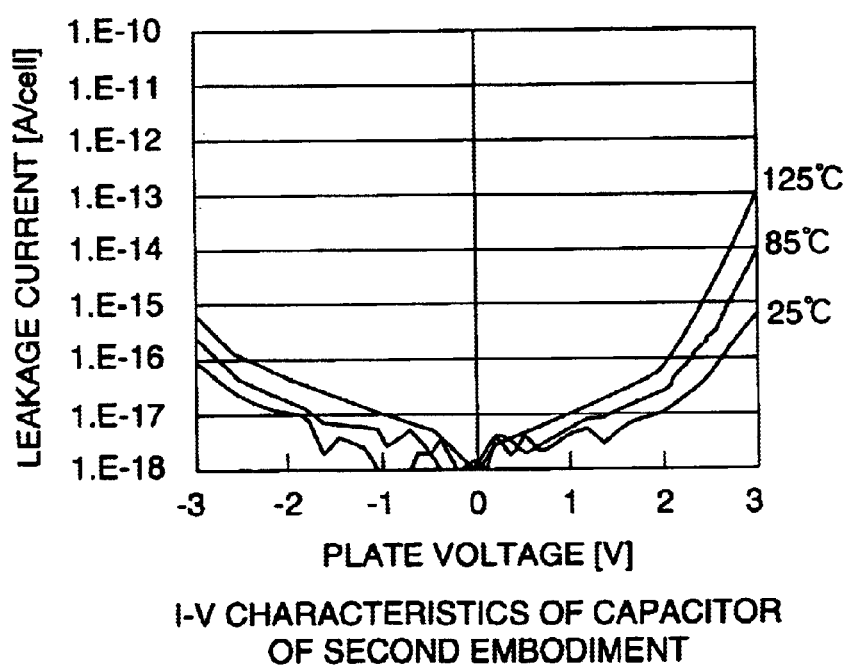
Figure 14C:
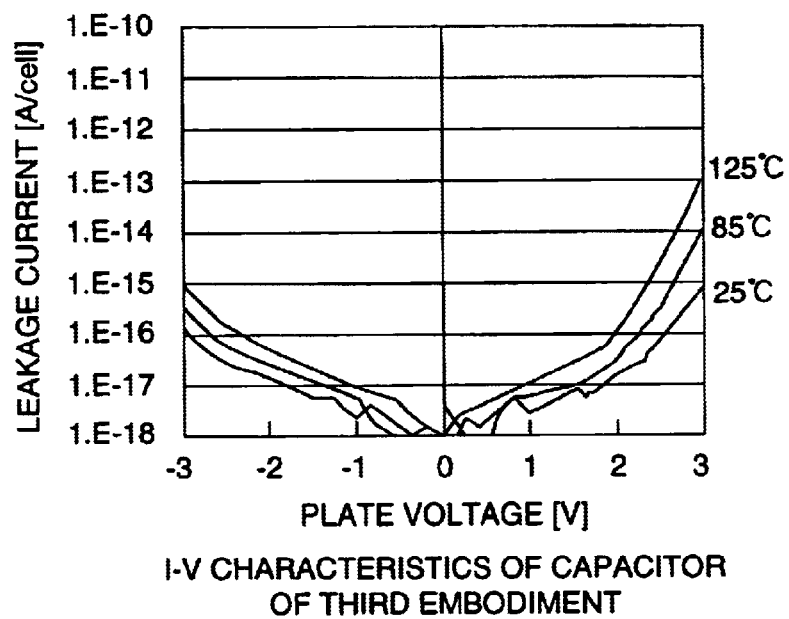
Figure 15:
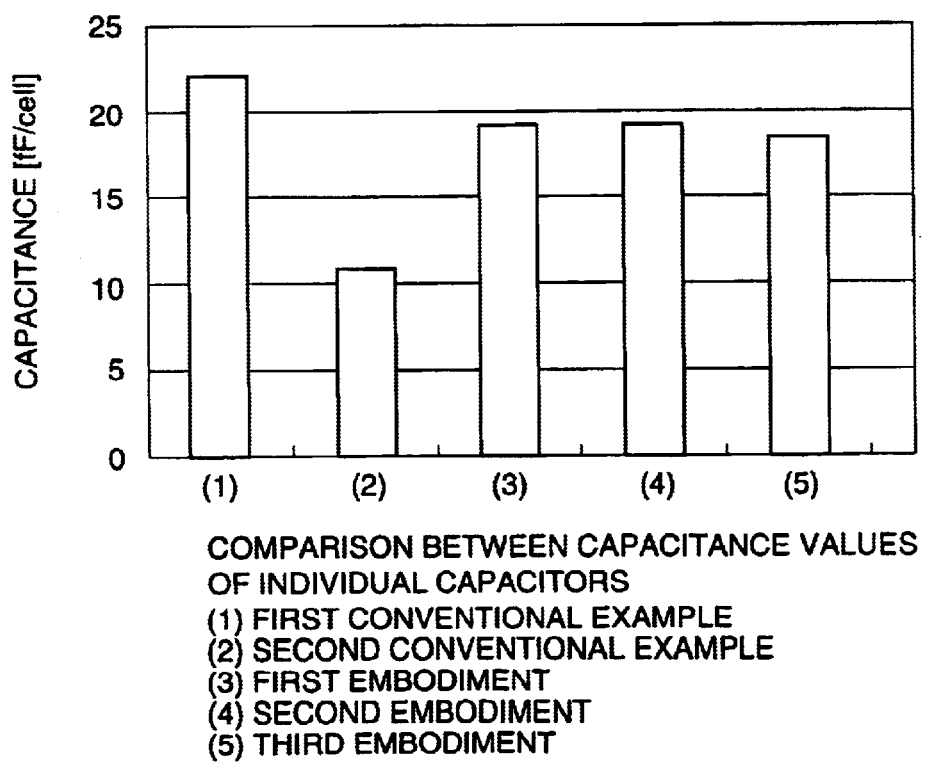
FIG. 15 illustrates how capacitance per unit area varies depending on the capacitor formation methods employed in the first and second conventional examples and the first through third embodiments.

FIGS. 14A–C are illustrations of how the capacitors formed using the methods, related to formation of capacitor, according to the first through third embodiments allow leakage current to flow therethrough and FIG. 15 illustrates how capacitance per unit area varies depending on the capacitor formation methods employed in the first and second conventional examples and the first through third embodiments. Although FIGS. 14A–C are all for the case where the first insulating film is a $ZrO_2$ film (when x=1 is substituted into the formula, $Zr_x Hf_{1-x} O_2$), FIGS. 14A–C are also for the case where the first insulating film is an $HfO_2$ film (when x=0 is substituted into the formula, $Zr_x Hf_{1-x} O_2$).

Figure 1A:
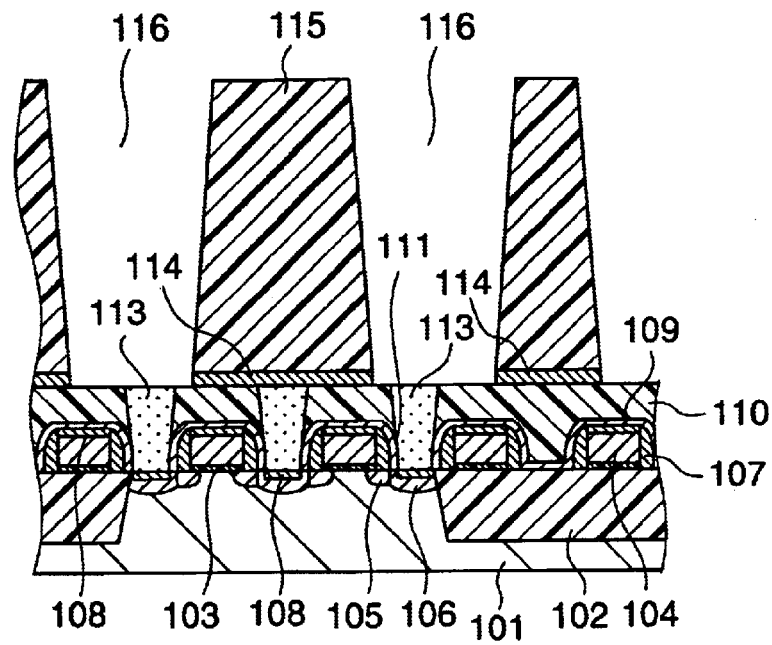
FIG. 1A illustrates a cross sectional view of a capacitor formed using the method according to a first conventional example in the order of manufacturing steps.
Figure 1B:
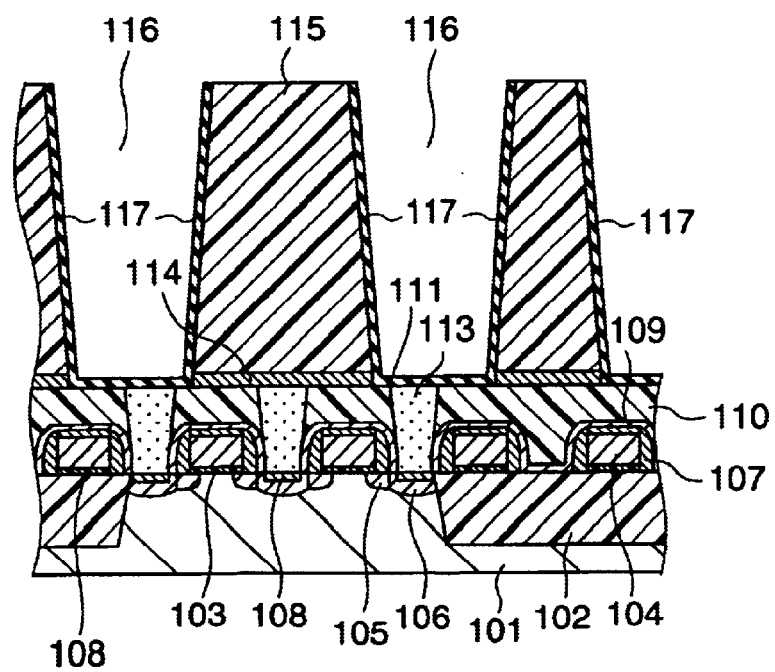
FIG. 1B is a cross sectional view illustrating the step subsequent to the step of FIG. 1A.
Figure 2A:
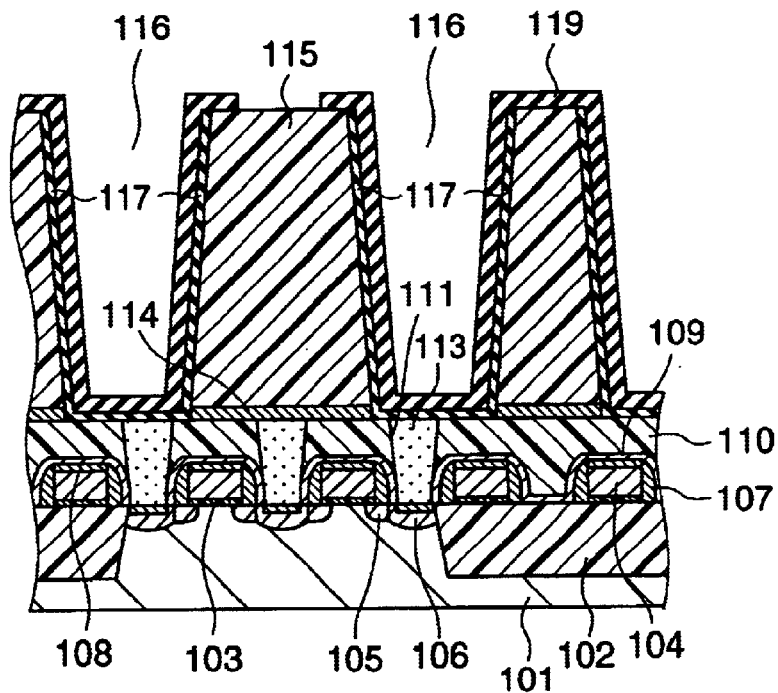
FIG. 2A is a cross sectional view illustrating the step subsequent to the step of FIG. 1B.
Figure 2B:
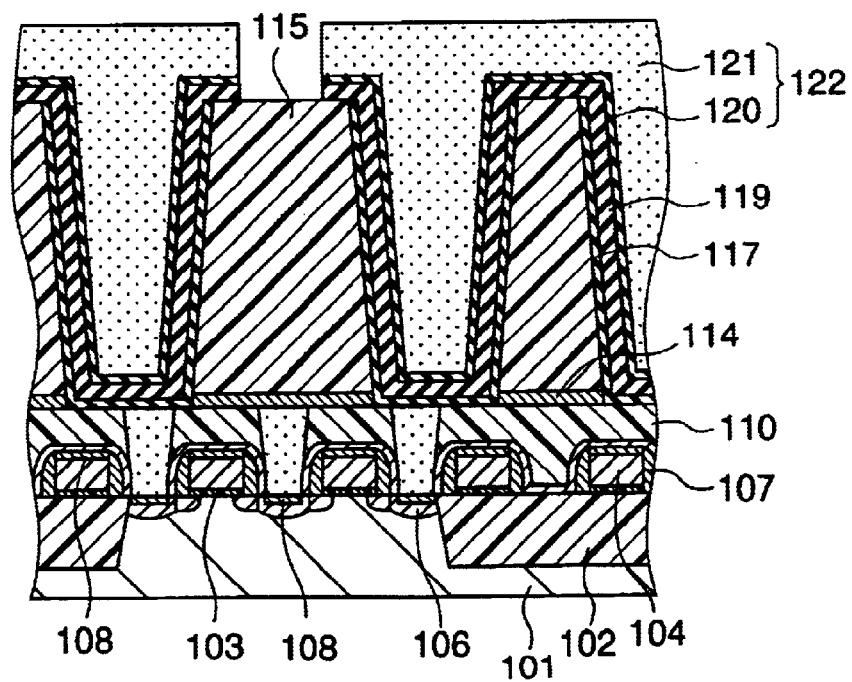
FIG. 2B is a cross sectional view illustrating the step subsequent to the step of FIG. 2A.
Figure 3A:
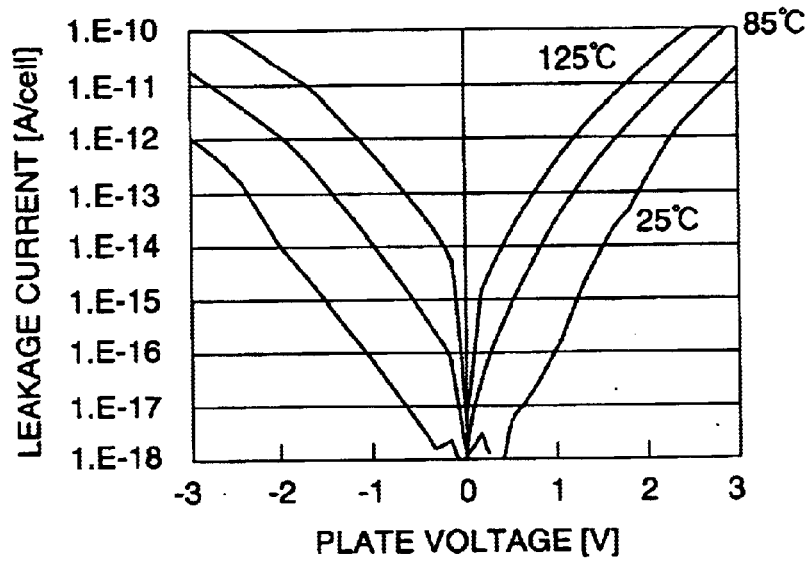
FIGS. 3A and 3B illustrate leakage characteristics of the capacitors formed using the methods according to the first conventional example and a second conventional example.
Figure 3B:
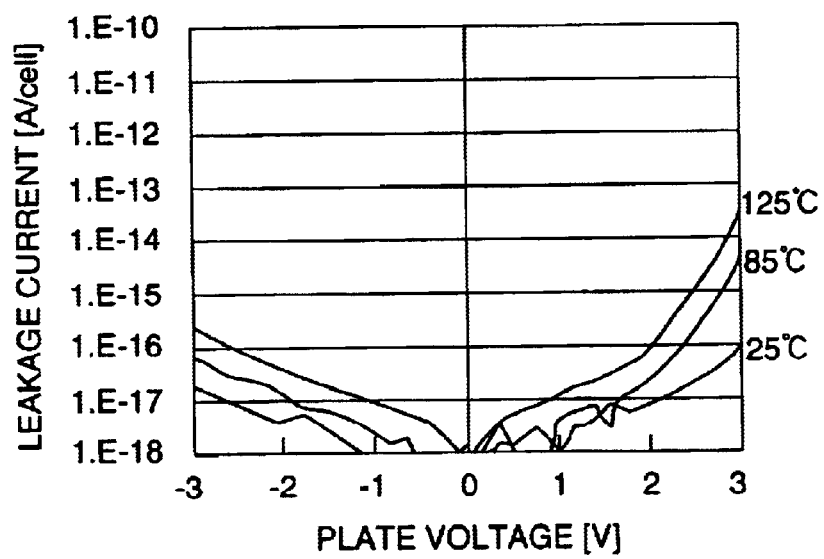
Figure 4A:
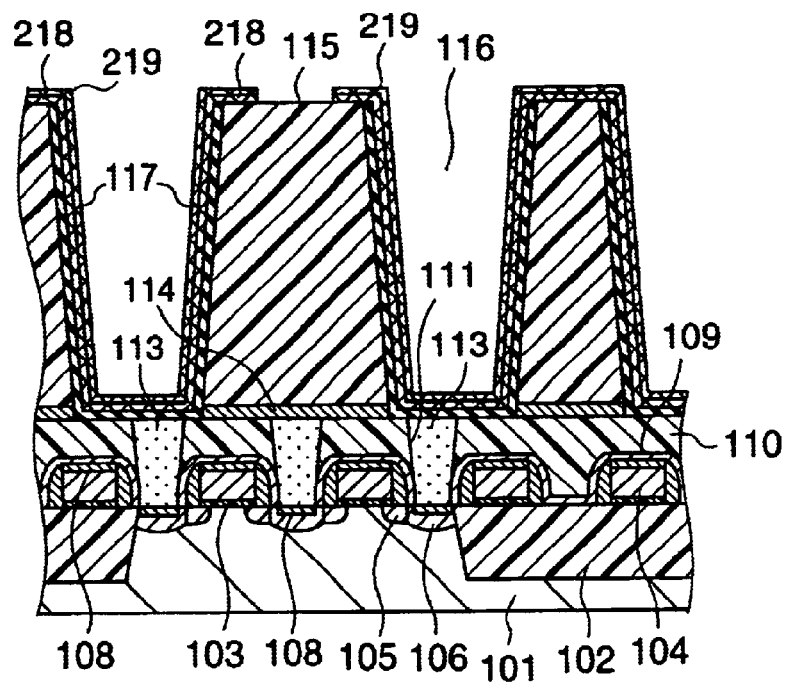
FIG. 4A illustrates a cross sectional view of a capacitor formed using the method according to the second conventional example in the order of manufacturing steps.
Figure 4B:
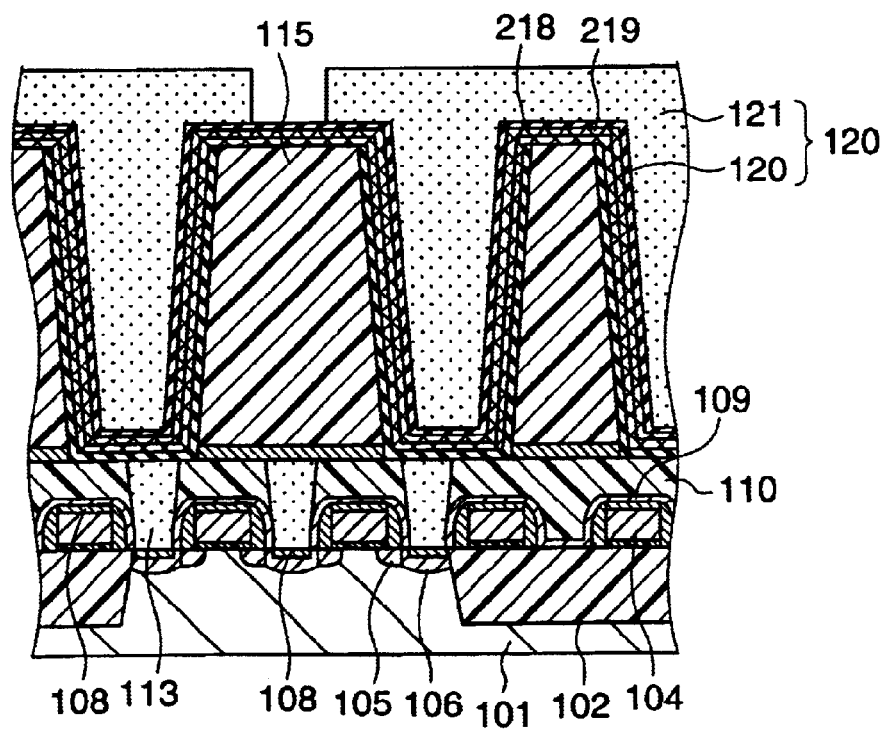
FIG. 4B is a cross sectional view illustrating the step subsequent to the step of FIG. 4A.

As can be seen from any one of the illustrations of how the capacitors of the first through third embodiments allow leakage current to flow therethrough, the degree of how much the leakage current flowing through each of the capacitors varies with voltage is maintained at a low level and is at a lower level than that observed when employing the capacitor of the first conventional example (refer to FIG. 3A). In addition, the capacitance per unit area of each of the capacitors of the first through third embodiments is greater than that of the capacitor of the second conventional example (refer to FIG. 15). Note that the capacitance per unit area of the capacitor of the third embodiment is relatively smaller than those of the capacitors of the first and second embodiments. This is because the thickness of the three layered capacitor dielectrics of the capacitor of the third embodiment is greater than that of the capacitor dielectrics of each of the capacitors of the first and second embodiments, and further, the ratio of the thickness of the $TiO_2$ film to the over all thickness of the three layered capacitor dielectrics in the third embodiment is small. It can be concluded that since how the leakage current flowing through each of the capacitors of the first through third embodiments varies with voltage is substantially similar to one another, two layered capacitor structure produces more beneficial effects than three layered capacitor structure.

When the capacitor is formed to include the first and second insulating films and both the first and second insulating films are formed from a metal containing organic compound, the first and second insulating films each maybe independently subjected to heat treatments after depositions of the corresponding metal oxide films. However, instead, the first and second insulating films would simultaneously be subjected to heat treatment after depositions of the corresponding metal oxide films. Accordingly, when the capacitor is formed to include as an intermediate layer the capacitor dielectrics formed from $TiCl_4$ as a reactant and interposed between the first and third insulating films as in the case of the third embodiment, the first and third insulating films would simultaneously be subjected to heat treatment after deposition of the final metal oxide film. That is, when employing the method for laminating capacitor dielectrics to form a capacitor according to the invention, although final heat treatment is indispensable after deposition of the final metal containing insulating film formed from a metal-containing organic compound as a reactant, heat treatments do not need to be performed after depositions of the metal containing insulating films that are formed from a metal-containing organic compound as a reactant and positioned below the final metal containing insulating film.

In the method for forming a capacitor according to the invention, the Zr- and/or Hf-containing oxide film (represented by the formula, $Zr_x Hf_{1-x} O_2$ film ($0 \leq x \leq 1$)) formed from a metal-containing organic compound as a reactant and the Ti-containing oxide film are laminated as capacitor dielectrics and residual carbon being retained in the capacitor dielectrics is removed by subjecting the capacitor dielectrics to heat treatment in an oxidizing ambient. Accordingly, the inventive method according to the invention is able to provide a capacitor that is optimal for use in DRAM and has high dielectric constant, and allows leakage current flowing therethrough to be maintained at a low level, and further, permits dependence of the leakage current on temperatures to be small.

Furthermore, in the inventive method according to the invention, the liquid or gas reactants for formation of capacitor dielectrics are employed to ensure that the reactants are delivered to the deposition chamber and as a result, the delivery of reactants becomes stable, allowing the capacitor to have electrical performance substantially unchanged between lots and wafers.

It is apparent that the present invention is not limited to the above embodiments and description, but may be changed or modified without departing from the scopes and spirits of methods claims that are indicated in the subsequent pages as well as apparatus claims that are indicated below:

AA. A capacitor comprising:
    a lower electrode and upper electrode;
    capacitor dielectrics constructed by a lamination including first and second insulating films, said capacitor dielectrics being interposed between said lower and upper electrodes, said first and second insulating films being a multicomponent $Zr_x Hf_{1-x} O_2$ film ($0<x<1$) and a $TiO_2$ film, respectively.

BB. The capacitor according to claim AA, wherein said capacitor dielectrics consists of two layers of said first and second insulating films, and a lower of said two layers is any one of said first and second insulating films.

CC. The capacitor according to claim AA, wherein said capacitor dielectrics consists of three layers of insulating films, and upper and lower of said three layers are said first insulating film, and a middle thereof is said second insulating film.

DD. The capacitor according to claim AA, wherein said lower electrode is formed of titanium nitride.

What is claimed is:

1. A method for forming a capacitor, comprising:
   (a) forming a lower electrode on a semiconductor substrate;
   (b) subjecting said substrate to an Atomic Layer Deposition (ALD) processing using a metal-containing organic compound containing one metal and an oxidizing agent to deposit a first metal oxide film on said lower electrode;
   (c) subjecting said substrate to heat treatment to be performed in an oxidizing ambient in order to remove residual carbon being retained in said first metal oxide film, resulting in formation of a first insulating film;
   (d) subjecting said substrate to an ALD processing using a metal-containing compound containing an alternative metal different from said one metal and an oxidizing agent to deposit a second metal oxide film on said first insulating film, resulting in formation of a second insulating film; and
   (e) forming an upper electrode on said second insulating film in order to form a capacitor including said lower electrode, first insulating film, second insulating film and upper electrode.

2. The method for forming a capacitor according to claim 1, further comprising between the steps (d) and (e):
   (f) subjecting said substrate to an ALD processing using a metal-containing organic compound containing and an oxidizing agent to deposit a third metal oxide film on said second insulating film;
   (g) subjecting said substrate to heat treatment to be performed in an oxidizing ambient in order to remove residual carbon being retained in said third metal oxide film, resulting in formation of a third insulating film.

3. The method for forming a capacitor according to claim 2, wherein said metal-containing organic compound employed in the step (f) contains said one metal.

4. The method for forming a capacitor according to claim 2, wherein said metal-containing organic compound employed in the step (f) contains a metal different from said one metal.

5. The method for forming a capacitor according to claim 1, wherein said one metal contains at least one of Zr and Hf.

6. The method for forming a capacitor according to claim 4, wherein said metal different from said one metal is titanium (Ti).

7. The method for forming a capacitor according to claim 1, wherein said oxidizing ambient and said oxidizing agent each contain ozone ($O_3$).

8. A method for forming a capacitor, comprising:
   (a) forming a lower electrode on a semiconductor substrate;
   (b) subjecting said substrate to an ALD processing using a metal-containing compound containing one metal and an oxidizing agent to deposit a first metal oxide film on said lower electrode, resulting in formation of a first insulating film;
   (c) subjecting said substrate to an ALD processing using a metal-containing organic compound containing a metal different from said one metal and an oxidizing agent to deposit a second metal oxide film on said first insulating film;
   (d) subjecting said substrate to heat treatment to be performed in an oxidizing ambient in order to remove residual carbon being retained in said second metal oxide film, resulting in formation of a second insulating film;
   (e) forming an upper electrode on said second insulating film in order to form a capacitor including said lower electrode, first insulating film, second insulating film and upper electrode.

9. The method for forming a capacitor according to claim 8, wherein said one metal is titanium (Ti).

10. The method for forming a capacitor according to claim 9, wherein said metal different from said one metal contains at least one of Zr and Hf.

11. The method for forming a capacitor according to claim 8, wherein said oxidizing ambient and said oxidizing agent each contain ozone ($O_3$).

12. A method for forming a capacitor, comprising:
   (a) forming a lower electrode on a semiconductor substrate;
   (b) subjecting said substrate to an ALD processing using a metal-containing organic compound containing one metal and an oxidizing agent to deposit a first metal oxide film on said lower electrode;
   (c) subjecting said substrate to an ALD processing using a metal-containing organic compound containing a metal different from said one metal and an oxidizing agent to deposit a second metal oxide film on said first metal oxide film;
   (d) subjecting said substrate to heat treatment to be performed in an oxidizing ambient in order to remove residual carbon being retained in said metal oxide films, resulting in formation of a capacitor film consisting essentially of said metal oxide films; and
   (e) forming an upper electrode on said capacitor film in order to form a capacitor including said lower electrode, capacitor film and upper electrode.

13. The method for forming a capacitor according to claim 12, further comprising between the steps (c) and (d):
   (f) subjecting said substrate to an ALD processing using a metal-containing organic compound containing said one metal and an oxidizing agent to deposit a third metal oxide film on said second metal oxide film.

14. The method for forming a capacitor according to claim 12, wherein said one metal contains at least one of Zr and Hf.

15. The method for forming a capacitor according to claim 14, wherein said metal differing from said one metal and employed in the step (c) is titanium (Ti).

16. The method for forming a capacitor according to claim 12, wherein said oxidizing ambient and said oxidizing agent each contain ozone ($O_3$).

* * * * *